United States Patent [19]

Kashima

[11] Patent Number: 5,794,133
[45] Date of Patent: Aug. 11, 1998

[54] MICROWAVE MIXING CIRCUIT

[75] Inventor: Yukiro Kashima, Osaka, Japan

[73] Assignee: Matsushita Electric Industrial Co., Ltd., Osaka, Japan

[21] Appl. No.: 700,996

[22] Filed: Aug. 21, 1996

[30] Foreign Application Priority Data

Aug. 21, 1995 [JP] Japan .................. 7-211969
Mar. 4, 1996 [JP] Japan .................. 8-045741

[51] Int. Cl.$^6$ ............................................ H04B 1/28
[52] U.S. Cl. ............................. 455/333; 455/327; 455/318
[58] Field of Search .............................. 455/318, 319, 455/323, 327, 333, 330, 334, 337, 338, 326; 333/103, 104, 116; 327/113, 355

[56] References Cited

U.S. PATENT DOCUMENTS

| | | | |
|---|---|---|---|
| 4,592,095 | 5/1986 | Ohishi et al. ............... | 455/319 |
| 4,593,411 | 6/1986 | Schiller ...................... | 455/323 |
| 4,658,440 | 4/1987 | Pavio et al. ................. | 455/327 |
| 5,153,469 | 10/1992 | Petted et al. ............... | 455/326 |
| 5,263,182 | 11/1993 | Park . | |
| 5,339,459 | 8/1994 | Schiltz et al. ............... | 455/333 |
| 5,428,839 | 6/1995 | Friesen et al. .............. | 455/333 |
| 5,428,840 | 6/1995 | Sadhir ....................... | 455/333 |
| 5,446,923 | 8/1995 | Martinson et al. .......... | 455/330 |
| 5,465,415 | 11/1995 | Bien .......................... | 455/318 |

FOREIGN PATENT DOCUMENTS

| | | |
|---|---|---|
| 0317642 | 5/1989 | European Pat. Off. . |
| 0523770 | 1/1993 | European Pat. Off. . |
| 263201 | 3/1990 | Japan . |
| 5022248 | 1/1993 | Japan . |
| 7183732 | 7/1995 | Japan . |
| 2220538 | 1/1990 | United Kingdom . |

*Primary Examiner*—Reinhard J. Eisenzopf
*Assistant Examiner*—Marsha D. Banks-Harold
*Attorney, Agent, or Firm*—Pollock, Vande Sande & Priddy

[57] ABSTRACT

A switchable microwave signal mixing circuit is disclosed which comprises: an osc 3 for generating an osc signal; 1st and 2nd microstrip lines 6, 7, coupled to the oscillator, for receiving 1st and 2nd microwave signals and the osc signal respectively; a bias voltage control circuit 54 for alternatively generating 1st and 2nd control bias voltages; 1st and 2nd FETs 8, 9, having 1st and 2nd gates supplied with the 1st and 2nd control bias voltages and coupled to the 1st and 2nd microstrip lines, drains supplied with bias voltages, and sources respectively, for alternatively generating 1st and 2nd IF signals from the 1st and 2nd microwave signals and the osc signal from the 1st and 2nd microstrip lines according to the control bias voltages; and an IF signal outputting circuit 14-18, 21 for outputting one of the IF signals selectively generated. In addition, a Wilkinson's divider 14-16 may be provided between the 1st and 2nd FETs and the outputting circuit for providing an isolation between the 1st and 2nd FETs. In addition, 1st and 2nd probing circuits 24, 25 coupled to the 1st and 2nd microstrip lines, for converting the 1st and 2nd microwaves into the 1st and 2nd microwave signals including 1st and 2nd TEM waves may be provided.

4 Claims, 5 Drawing Sheets

MICROWAVE MIXING CIRCUIT

BACKGROUND OF THE INVENTION

1. Field of the Invention

This invention relates to a microwave mixing circuit for receiving a microwave signal and outputting an intermediate frequency signal from the microwave signal.

2. Description of the Prior Art

A microwave mixing circuit, including an oscillator for generating an oscillation signal, a microstrip line for receiving a microwave signal and the oscillation signal, a PIN diode for generating an intermediate frequency signal from the received microwave signal and the oscillation signal is known.

FIG. 4 is a plan view of a prior art microwave mixing circuit partially schematically shown. This prior art microwave mixing circuit has a polarizing direction switching and intermediate frequency amplifying functions. Vertical and horizontal polarizing microwave signals of 12 GHz band are supplied to microstrip lines 6 and 7 through inputs 1 and 2 respectively. The received vertical and horizontal polarizing microwave signals are mixed with a local oscillation signal having an oscillation frequency of 11.2 GHz through bandpass filters 4 and 5 by to generate intermediate frequency signals of 1 GHz band by Schottky barrier diodes 48 and 49. Anodes of the Schottky barrier diodes 48 and 49 are also supplied with bias current in the forward directions to reduce conversion losses which may be caused when intensities of the local oscillation signals are small. The intermediate frequency signals are amplified by intermediate frequency amplifiers 34 and 35, 36 and 37 through lowpass filters 12 and 13 and supplied to PIN diodes 38 and 39.

On the other hand, a comparator is supplied with a dc control signal having a voltage of either of 11 or 15 volt from the terminal 45 and compares the dc control signal with a reference voltage. The comparing result is supplied to bases of transistors 42 and 43. When the dc control signal has a voltage of 11 volts, the transistor 42 is turned on and the transistor 43 is turned off, so that the only intermediate frequency amplifiers 36 and 37 and the PIN DIODE 39 are actuated. Therefore, the intermediate frequency signal derived from the horizontal polarizing microwave signal is outputted at the terminal 45 through amplifiers 40 and 41. Similarly, when the dc control signal has the voltage of 15 volts, the transistor 43 is turned on and the transistor 42 is turned off, so that the only intermediate frequency amplifiers 34 and 35 and the PIN DIODE 38 are actuated. Therefore, the intermediate frequency signal derived from the vertical polarizing microwave signal is outputted at the terminal 45 through amplifiers 40 and 41.

SUMMARY OF THE INVENTION

The aim of the present invention is to provide an improved microwave mixing circuit.

According to the present invention there is provided

A first switchable microwave signal mixing circuit is provided which comprises: an oscillator 3 for generating an oscillation signal; first and second microstrip lines 6, 7, coupled to the oscillator, for receiving first and second microwave signals and the oscillation signal respectively; a bias voltage control circuit 54 for alternatively generating first and second control bias voltages; first and second FETs 8, 9, having first and second gates supplied with the first and second control bias voltages and coupled to the first and second microstrip lines, drains supplied with bias voltages, and sources respectively, for alternatively generating first and second IF signals from the first and second microwave signals and the oscillation signal from the first and second microstrip lines according to the control bias voltages; and an IF signal outputting circuit 14–18, 21 for outputting one of the IF signals selectively generated. In addition, a Wilkinson's divider 14–16 may be provided between the first and second FETs and the outputting circuit for providing an isolation between the first and second FETs. In addition, first and second probing circuits 24, 25 coupled to the first and second microstrip liens, for converting the first and second microwaves into the first and second microwave signals including first and second TEM waves may be provided.

According to the present invention there is also provided a second switchable microwave signal mixing circuit is provided which comprises: an oscillator for generating an oscillation signal; a plurality of microstrip lines for receiving a plurality of microwave signals respectively, the plurality of microstrip lines being coupled to the oscillator; a bias voltage control circuit for supplying control bias voltages; a plurality of FETs, having gates supplied with control bias voltages and coupled to the microstrip lines, drains supplied with bias voltages, and sources respectively, for selectively generating intermediate frequency signals from the microwave signals and the oscillation signal from the microstrip lines in accordance with the control bias voltages; and an intermediate frequency signal outputting circuit for outputting one of the intermediate frequency signals selectively generated.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
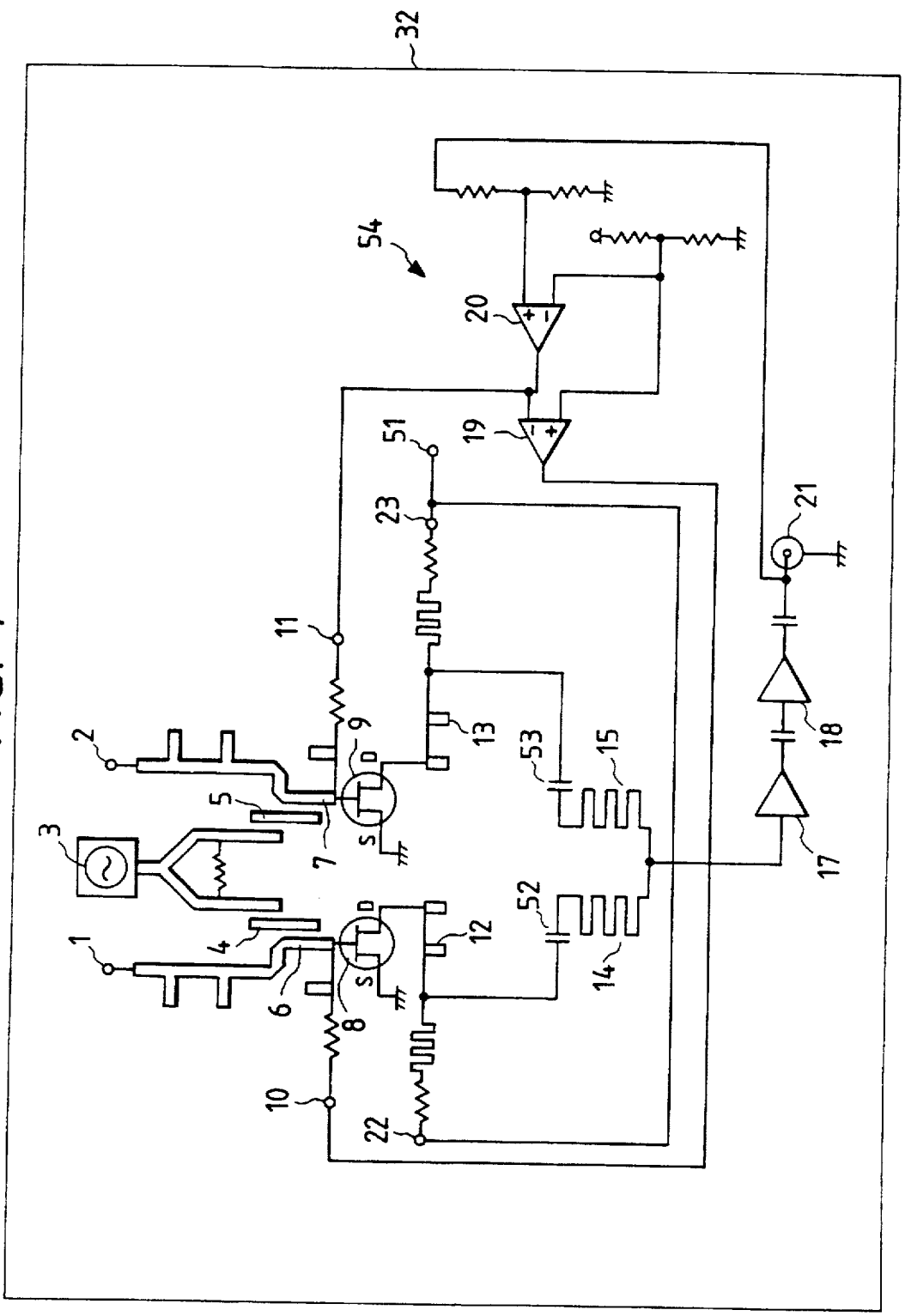
FIG. 1 is a plan view of a switchable microwave mixing circuit of a first embodiment partially schematically shown.

FIG. 1 is a plan view of a switchable microwave mixing circuit of the first embodiment partially schematically shown.

A switchable microwave signal mixing circuit of the first embodiment, formed on a substrate 32, comprises an oscillator 3 for generating an oscillation signal, first and second microstrip lines 6 and 7, coupled to the oscillator 3 through bandpass filters 4 and 5, for receiving first and second microwave signals through terminals 1 and 2 and the oscillation signal respectively, a bias voltage control circuit 54 including first and second comparators 19 and 20 and a terminal 21 responsive to a switching control signal, for alternatively generating first and second control bias voltages, first and second (GaAs) FETs 8, 9, having first and second gates supplied with the first and second control bias voltages and coupled to the first and second microstrip lines 6 and 7, drains supplied with bias voltages from a terminal 51, and sources connected to the ground respectively, for alternatively generating first and second intermediate frequency signals from the first and second microwave signals and the oscillation signal from the first and second microstrip lines 6 and 7 in accordance with the control bias voltages, an intermediate frequency signal outputting circuit, including lowpass filters 12 and 13, capacitors 52 and 53, microstrip lines 14 and 15, each having a quarter of wavelength of the intermediate frequency, an intermediate frequency amplifier 17 coupled to the microstrip line 14 together with the microstrip line 15, for outputting one of the intermediate frequency signals selectively generated at the terminal 21 through ac coupling capacitors.

The bias voltage control circuit 54 includes the first and second comparators 19 and 20 and the terminal 21 responsive to a switching control signal for alternatively generating first and second control bias voltages. The switching control signal for switching the polarizing direction of the microwave signal to be received has a voltage of either of 11 volts or 15 volts supplied from a satellite broadcast receiving tuner (not shown) for example.

An operation will be described.

The second comparator 20 detects whether or no the switching control signal has the voltage of about 15 voltages. When the second comparator 20 is supplied with the switching control signal having the voltage of about 15 volts, the second comparator 20 supplies a HIGH voltage (for example, a minus voltage near zero voltage) to the gate of the second FET 9 through a terminal 11 and a resistor.

In this condition, the second microwave signal of 12 GHz band provided by receiving a horizontal polarized microwave signal is supplied to the microstrip line 7 through the terminal 2 and the local oscillation signal having a local oscillation frequency of 11.2 GHz for example, from the local oscillator 3 is also supplied to the microstrip line 7 through the bandpass filter 5. The drain of the second FET 9 is supplied with a drain current near $I_{DSS}$ from the bias voltage from the terminal 51. The second FET 9 converts the second microwave signal into an intermediate frequency signal of 1 GHz band. Since the drain of the second FET 9 is supplied with the drain current near $I_{DSS}$ from the bias voltage from the terminal 51, though an output supplied from the local oscillator 3 through the bandpass filter 5 is weak, a suitable conversion characteristic is provided.

The intermediate frequency signal is band-passed by a band pass filter 13 and is supplied to the intermediate frequency amplifier 17 through the microstrip line 15 and is amplified by the intermediate frequency amplifiers 17 and 18 and outputted at the terminal 21.

The input of the intermediate frequency amplifier 17 is also connected to the microstrip line 14 for receiving the intermediate frequency from the first FET 8. However, in this condition, the gate of the first FET 8 is supplied with the bias control signal having a LOW level having a negative voltage near a pinch off voltage and the drain of the first FET 8 is supplied with a drain current near zero, a reflection loss to the microwave signal of the 12 GHz in the first FET 8 is large so that a non-linear operation is not effected. Moreover, a conversion loss is extremely large at the low frequency of the local oscillation output. Therefore, the frequency conversion is not provided at the first FET 8 in this condition. Thus, the microwave signal is introduced into the microstrip line 14. The microstrip lines 14 and 15, each having a quarter of the wavelength, act as a matching circuit and provide an isolation each other, so that only the intermediate frequency signal from the second FET 9 is supplied to the intermediate frequency amplifier 17 and the intermediate frequency signal corresponding the microwave signal from the microstrip line 7 is outputted at the terminal 21.

In the condition that the switching control signal having 11 voltages is supplied to the terminal 21, the first FET 8 is turned on and the second FET 9 is turned off. Therefore, the microwave signal from the terminal 1 from vertical polarized wave is converted into an intermediate frequency signal and outputted at the terminal 21.

A second embodiment will be described.

Figure 2:
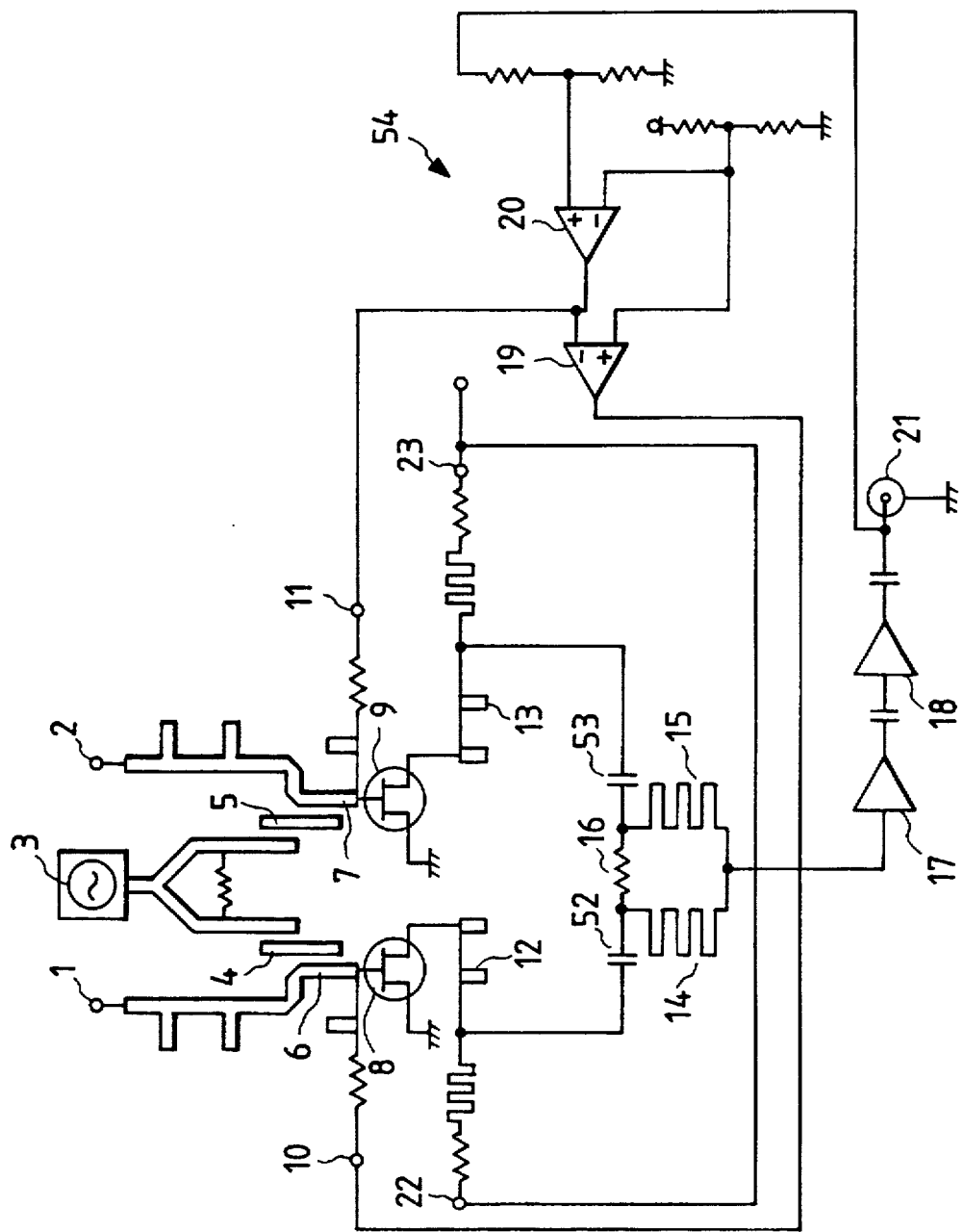
FIG. 2 is a plan view of a switchable microwave mixing circuit of a second embodiment partially schematically shown.

FIG. 2 is a plan view of a switchable microwave mixing circuit of the second embodiment partially schematically shown.

The basic structure and the operation of the second embodiment is substantially the same as the first embodiment. The difference is in that an absorbing resistor 16 is further provided.

A first end of the absorbing resistor 16 is connected to one end of the microstrip line 14 coupled to the capacitor 52 and the second end of the absorbing resistor 16 is connected to one end of the microstrip line 15 coupled to the capacitor 53.

The microstrip lines 14 and 15 and the absorbing resistor 16 forms a Wilkinson's divider, so that the microstrip lines 14 and 15 are isolated each other. Therefore, either of first or second microwave signal is outputted from the terminal 21 with a favorable isolation.

The wilkinson's divider is described in "A method of forming high frequency and microwave circuits" by Yoshihiro Konishi, Jun. 20, 1993, which refers a portion of page 205 to 207 of "Optimum Design of 3-dB Branch-Line Couplers using Microstrip Lines" IEEE Trans. MTT vol. 31 No. 8 August 1983 pp 674–678.

Figure 5:
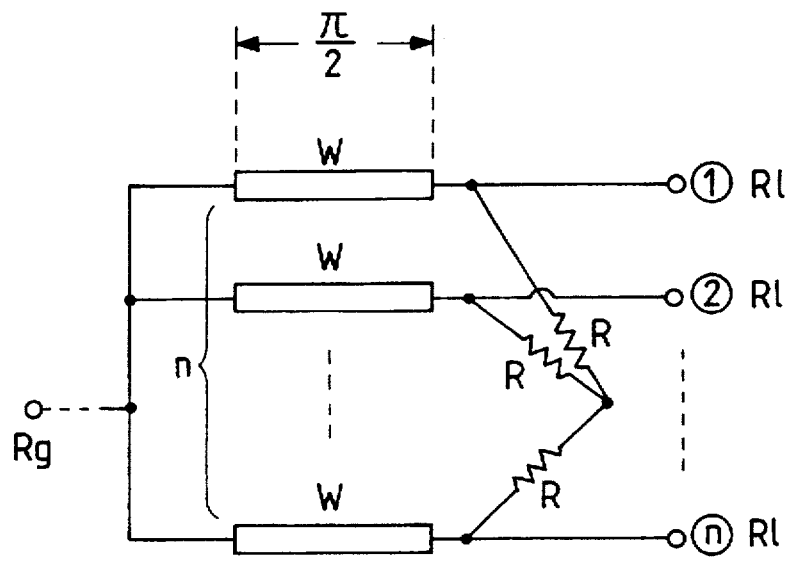
FIG. 5 is a circuit diagram of a prior art Wilkinson's divider.
Figure 6:
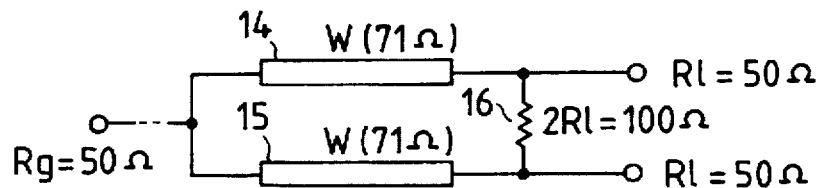
FIG. 6 is a circuit diagram of a portion of the switchable microwave mixing circuit of a second embodiment.

FIG. 5 is a circuit diagram of a prior art Wilkinson's n divider shown in "A method of forming high frequency and microwave circuits" at page 135. References W denotes a characteristic impedance of a microstrip line having a length of π/2 and references R denotes an absorbing resistor for isolation between respective output terminals, wherein $W = (nR_L Rg)^{1/2}$ $R = R_L$ FIG. 6 is a circuit diagram of a portion of the microwave mixing circuit of the second embodiment.

It is assumed that Rg=50 Ω, n=2, and $R_L$=50 Ω. Then, $$W = (2 \times 50 \times 50)^{1/2}$$
$$= 71 \, \Omega$$

Therefore, the resistance of the absorbing resistor 16 is $2R_L$=100 Ω.

A third embodiment will be described.

Figure 3:
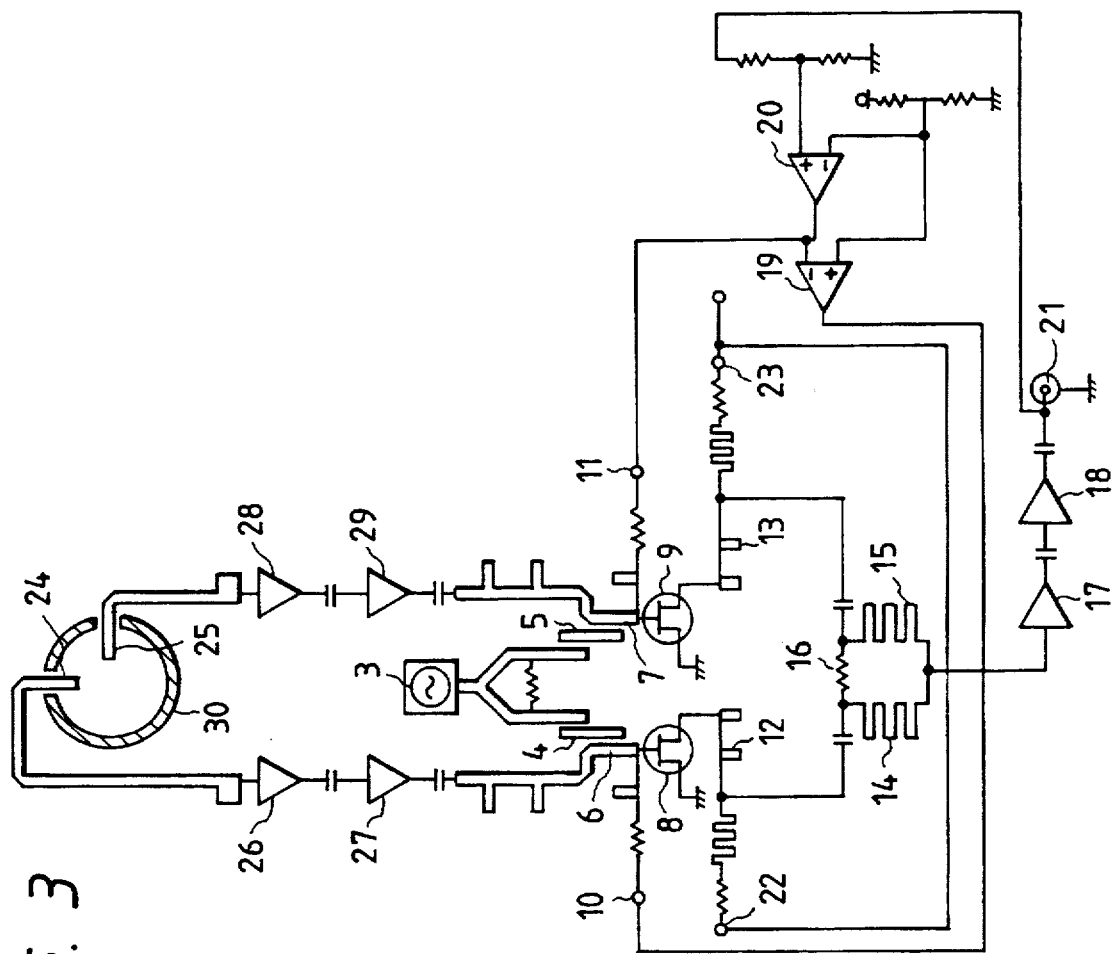
FIG. 3 is a plan view of a switchable microwave mixing circuit of a third embodiment partially schematically shown.
Figure 4:
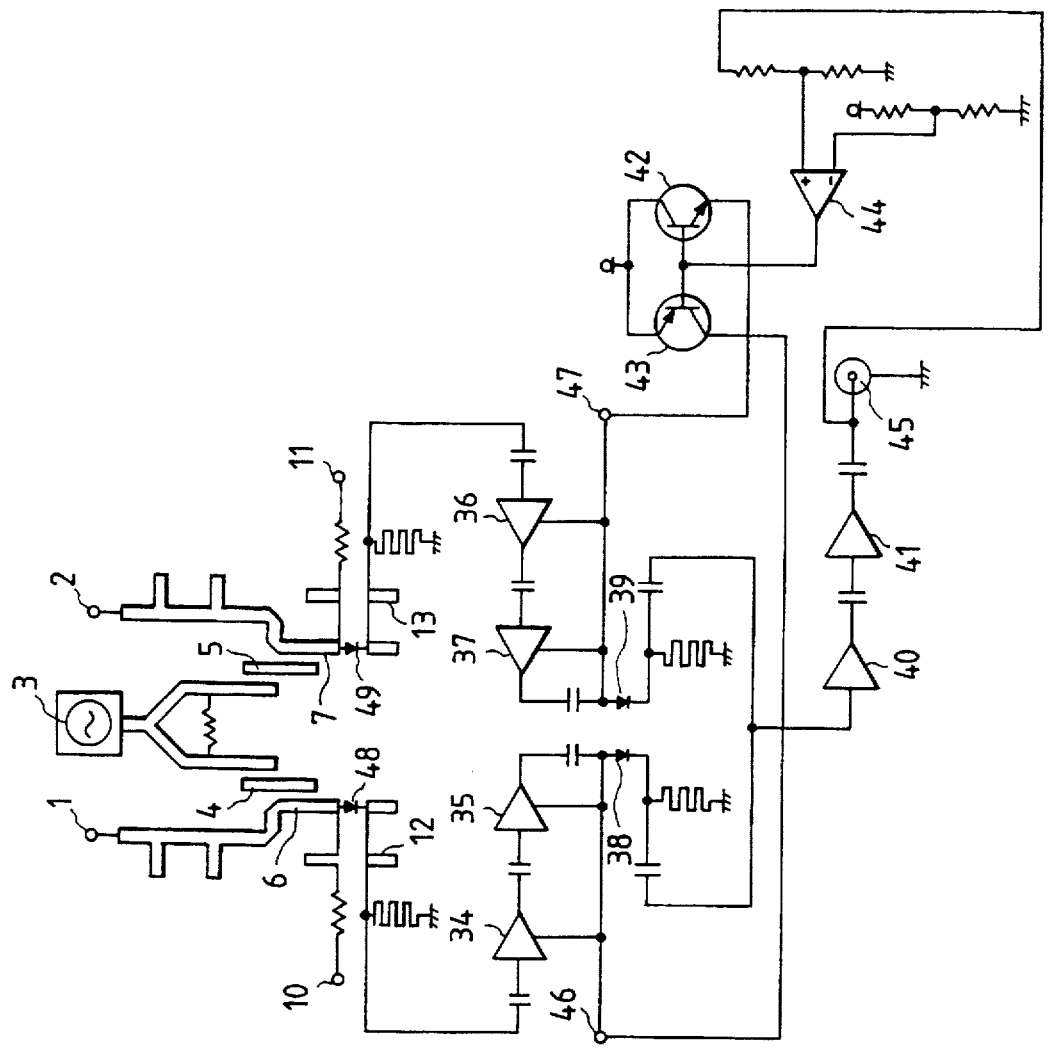
FIG. 4 is a plan view of a prior art microwave mixing circuit partially schematically shown.

FIG. 3 is a plan view of a switchable microwave mixing circuit of the third embodiment partially schematically shown.

A switchable microwave signal mixing circuit of the third embodiment comprises first and second probing circuits 24 and 25 coupled to first and second microstrip liens 6 and 7 through low noise amplifiers 26 and 27, and 28 and 29, each including HEMT, for receiving microwaves from a waveguide 30 (a cross section is shown in the drawing) and converting the horizontally polarizing and vertically polarizing microwaves into first and second microwave signals, including first and second TEM waves components, supplied to said first and second microstrip lines 6 and 7 respectively, coupled to the oscillator 3 through bandpass filters 4 and 5, for receiving first and second microwave signals through terminals 1 and 2 and the oscillation signal respectively, a bias voltage control circuit 54 including first and second comparators 19 and 20 and a terminal 21 responsive to a switching control signal, for alternatively generating first and second control bias voltages, first and second (GaAs) FETs 8, 9, having first and second gates supplied with the first and second control bias voltages and coupled to the first and second microstrip lines 6 and 7, drains supplied with bias voltages from a terminal 51, and sources connected to the ground respectively, for alternatively generating first and second intermediate frequency signals from the first and second microwave signals and the oscillation signal from the first and second microstrip lines 6 and 7 in accordance with the control bias voltages, an intermediate frequency signal outputting circuit, including lowpass filters 12 and 13, capacitors 52 and 53, microstrip lines 14 and 15 with an absorbing resistor 16, each having a quarter of wavelength of the intermediate frequency, an intermediate frequency amplifier 17 coupled to the microstrip line 14 together with the microstrip line 15, for outputting one of the intermediate frequency signals selectively generated at a terminal 21 through ac coupling capacitors.

An operation of the third embodiment will be described.

The second comparator 20 detects whether or not the switching control signal has the voltage of about 15 voltages. When the second comparator 20 is supplied with the switching control signal having the voltage of about 15 voltages, the second comparator 20 supplies a HIGH voltage (for example, a minus voltage near zero voltage) to the gate of the second FET 9 through the terminal 11 and a resistor.

In this condition, the second microwave signal of 12 GHz band provided by receiving a horizontally polarizing microwave signal from the waveguide 30 coupled to an antenna (not shown) receiving a satellite broadcast signal is converted into the quasi-TEM waves and supplied to the microstrip line 7 as the second microwave signal. The microstrip line 7 is also supplied with the local oscillation signal having a local oscillation frequency of 11.2 GHz for example, from the local oscillator 3 through the bandpass filter 5. The drain of the second FET 9 is supplied with a drain current near $I_{DSS}$ from the bias voltage from the terminal 51. The second FET 9 converts the second microwave signal into an intermediate frequency signal of 1 GHz band. Since the drain of the second FET 9 is supplied with the drain current near $I_{DSS}$ from the bias voltage from the terminal 51, though an output supplied from the local oscillator 3 through the bandpass filter 5 is weak, a suitable conversion characteristic is provided.

The intermediate frequency signal is band-passed by a band pass filter 13 and is supplied to the intermediate frequency amplifier 17 through the microstrip line 15 and is amplified by the intermediate frequency amplifiers 17 and 18 and outputted at the terminal 21.

The input of the intermediate frequency amplifier 17 is also connected to the microstrip line 14 for receiving the intermediate frequency from the first FET 8. However, in this condition, the gate of the first FET 8 is supplied with the bias control signal having a LOW level having a negative voltage near a pinch off voltage and the drain of the first FET 8 is supplied with a drain current near zero, a reflection loss to the microwave signal of the 12 GHz in the fist FET 8 increases so that a non-linear operation is not effected. Moreover, a conversion loss extremely increases at the low frequency of the local oscillation output. Therefore, the frequency conversion is not provided at the first FET 8. Thus, the microwave signal is introduced into the microstrip line 14. The microstrip lines 14 and 15 with the absorbing resistor 16, each microstrip line having a quarter of the wavelength, provide an isolation each other, so that only the intermediate frequency signal from the second FET 9 is supplied to the intermediate frequency amplifier 17 and the intermediate frequency signal of 1 GHz band corresponding to the horizontally polarizing microwaves from the probe 24 is outputted at the terminal 21.

When the switching control signal having 11 voltages is supplied to the terminal 21, the first FET 8 is turned on and the second FET 9 is turned off. Therefore, the microwave signal from vertical polarized wave through the probe 25 is converted into an intermediate frequency signal of 1 GHz band and the intermediate frequency signal is outputted at the terminal 21.

What is claimed is:

1. A switchable microwave signal mixing circuit comprising:

an oscillator for generating an oscillation signal;

first and second microstrip lines, coupled to said oscillator, for receiving first and second microwave signals and said oscillation signal respectively;

a bias voltage control circuit for alternatively generating first and second control bias voltages;

first and second FETs, having first and second gates supplied with said first and second control bias voltages and coupled to said first and second microstrip lines, drains supplied with bias voltages, and sources respectively, for alternatively generating first and second intermediate frequency signals from said first and second microwave signals and said oscillation signal from said first and second microstrip lines in accordance with said control bias voltages; and an intermediate frequency signal outputting circuit for outputting one of said intermediate frequency signals selectively generated.

2. A switchable microwave signal mixing circuit as claimed in claim 1, further comprising a Wilkinson's divider provided between said first and second FETs and said outputting circuit for providing an isolation between said first and second FETs.

3. A switchable microwave signal mixing circuit as claimed in claim 1, further comprising first and second probing circuits coupled to said first and second microstrip lines, for receiving first and second microwaves and converting said first and second microwaves into said first and second microwave signals including first and second TEM waves supplied to said first and second microstrip lines respectively.

4. A switchable microwave signal mixing circuit comprising:

an oscillator for generating an oscillation signal;

a plurality of microstrip lines for receiving a plurality of microwave signals respectively, said plurality of microstrip lines being coupled to said oscillator;

a bias voltage control circuit for supplying control bias voltages;

a plurality of FETs, having gates supplied with control bias voltages and coupled to said microstrip lines, drains supplied with bias voltages, and sources respectively, for selectively generating intermediate frequency signals from said microwave signals and said oscillation signal from said microstrip lines in accordance with said control bias voltages; and an intermediate frequency signal outputting circuit for outputting one of said intermediate frequency signals selectively generated.

* * * * *